(12) United States Patent
Ueno

(10) Patent No.: US 6,639,273 B1
(45) Date of Patent: Oct. 28, 2003

(54) SILICON CARBIDE N CHANNEL MOS SEMICONDUCTOR DEVICE AND METHOD FOR MANUFACTURING THE SAME

(75) Inventor: Katsunori Ueno, Kanagawa (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/386,639

(22) Filed: Aug. 31, 1999

(30) Foreign Application Priority Data

Sep. 1, 1998  (JP) ............................................ 10-247376
Oct. 5, 1998  (JP) ............................................ 10-282202

(51) Int. Cl.$^7$ ................................................ H01L 29/76

(52) U.S. Cl. .................... 257/329; 257/77; 257/215; 257/235; 257/249; 257/262; 257/288; 257/328; 257/341; 257/342

(58) Field of Search ...................... 257/77, 341, 342, 257/345, 263, 266, 270, 328, 329

(56) References Cited

U.S. PATENT DOCUMENTS 5,506,421 A * 4/1996 Palmour ...................... 257/77
5,776,837 A * 7/1998 Palmour ...................... 438/767
6,002,143 A * 12/1999 Terasawa ..................... 257/77

OTHER PUBLICATIONS

K. Hara, "Vital Issues for SiC Power Devices", Materials Science Forum vols. 264–268 (1998), pp. 901–906, 1998. Trans Tech Pub., Switzerland. P.M. Shenoy et al., "High Voltage Planar 6H–SiC Accufet" Materials Science Forum vols. 264–268 (1998), pp. 993–996, 1998 Trans Tech Pub., Switzerland.

* cited by examiner

Primary Examiner—Long Pham
Assistant Examiner—Wai-Sing Louie
(74) Attorney, Agent, or Firm—Rossi & Associates

(57) ABSTRACT

A silicon carbide n channel MOS semiconductor device is provided which includes a silicon carbide substrate including a p base region, an $n^{30}$ source region and an $n^+$ drain region, a gate insulating film formed on a surface of the p base region, a gate electrode provided on the gate insulating film, and first and second main electrodes that allow current to flow therebetween, wherein a $p^-$ channel region is formed in a surface layer of the p base region right under the gate insulating film, such that the effective acceptor concentration measured in the vicinity of an interface between the p base region and the gate insulating film is in a range of $1\times10^{13}$ to $1\times10^{16}$ cm$^{-3}$. A method for manufacturing such a MOS semiconductor device is also provided in which the $p^-$ channel region is formed by conducting multiple ion implantation in which the amount of ions to be implanted is reduced in the vicinity of the surface of the p base region, or implanting ions of donor impurities into a surface layer of the p base region, or forming a low-concentration layer by epitaxial growth as a surface layer of the p base region.

10 Claims, 11 Drawing Sheets

SILICON CARBIDE N CHANNEL MOS SEMICONDUCTOR DEVICE AND METHOD FOR MANUFACTURING THE SAME

FIELD OF THE INVENTION

The present invention relates to a silicon carbide MOS semiconductor device, such as a field-effect transistor (hereinafter referred to as "MOSFET") having a gate of metal-oxide-semiconductor structure, which device uses silicon carbide (hereinafter referred to as "SiC") as a semiconductor material. The present invention also relates to a method for manufacturing such MOS semiconductor devices.

BACKGROUND OF THE INVENTION

SiC is a semiconductor material that has been highly expected to be used in power semiconductor devices or semiconductor devices for high-temperature use. Among various types of power semiconductor devices, those called MOSFET have particularly simple structures, and may be used in a considerably wide range of applications. Accordingly, more and more studies have been conducted on fabrication of MOSFET using SiC. Another reason for extensive development and studies of SiC MOSFET is that a silicon dioxide film is grown on SiC (hereinafter referred to as "$SiO_2$ film") thereon through thermal oxidation, as in the case of silicon (hereinafter referred to as Si), and therefore the same process for manufacturing MOSFET using Si as a semiconductor material may be used for manufacturing SiC MOSFET. Some research groups or researchers including the inventor of the present invention have fabricated MOSFETs using SiC, and reported their characteristics.

The SiC MOSFET, however, suffers from an extremely low mobility of electrons in an inversion layer formed in its surface. SiC is known as having crystalline polymorphism, namely, SiC crystallizes into two or more forms having different structures. Single crystals of SiC currently available in the market include 6H—SiC and 4H—SiC, both of which are alpha-phase SiC in which a zinc-blend structure and a wurtzite structure are superposed on each other. Of these single crystals, 4H—SiC has a relatively higher electron mobility than 6H—SiC, and is thus more expected to be applied to power devices.

FIG. 10 is a cross-sectional view of a vertical MOSFET having a general DMOS structure. In FIG. 10, a p base region 12 is formed in a surface layer of an n drift layer 11a, and an n+ source region 13 is formed in the p base region 12. A gate electrode 16 is formed on a gate insulating film 15, over a part of the surface of the p base region 12 that is interposed between the n+ source region 13 and an exposed surface portion of the n drift layer 11a. Also, a source electrode 17 is formed in contact with surfaces of both the n+ source region 13 and the p base region 12a, and a drain electrode 18 is formed in contact with the rear surface of an n+ drain region 14.

In the operation of the MOSFET as described above, when a positive voltage is applied to the gate electrode 16, an inversion layer is induced in a surface layer of the p base region 12 right under the gate insulating film 15, so that current flows between the source electrode 17 and the drain electrode 18. If the positive voltage to the gate electrode 16 is removed, the inversion layer right under the gate insulating film 15 disappears, and a depletion layer spreads out, thus blocking current flow through the p base region 12.

As described above, currently available SiC n-channel MOSFET suffers from a low mobility of electrons in its inversion layer. In a 6H—SiC MOSFET, for example, an inversion layer has electron mobility of about 70 $cm^2$/V.s (as reported in Lipkin, L. A. and Palmour, J. W.: J. Electronic. Materials Vol. 25 (1996) p.909). In a MOSFET using 4H—SiC and fabricated under the same conditions, on the other hand, only a considerably low electron mobility, more specifically, 10 $cm^2$/V.s or lower, can be obtained. In recent studies, the inventor and others found that the electron mobility of 4H—SiC MOSFET may be increased to 20 $cm^2$/V.s at the most, even with various changes or improvements in the manufacturing process (as reported in IEEE Electron Device lett. Vol. 19 (1998), p.244).

It follows that the electron mobility of 4H—SiC devices is significantly lower than that of 6H—SiC devices, and even 6H—SiC devices need to provide a higher mobility. Thus, such semiconductor devices that take advantage of low resistance as an inherent property of SiC crystal have not yet been successfully fabricated.

To overcome the above problem, there has been reported some semiconductor devices called ACCUFET, wherein a low-concentration n-type layer is formed below a gate electrode, and an accumulation layer, rather than an inversion layer, is used as a conduction layer.

FIG. 11 is a cross-sectional view of a part of a planar-type ACCUFET proposed by Shenoy et al. (refer to Shenoy, P. M. and Baliga, B. J.: Materials Science Forum Vols. 264–268 (1998) p.993).

In the ACCUFET of FIG. 11, an n channel region 30, rather than a p type region, is formed in a surface layer right under a gate insulating film 25. When a positive voltage is applied to a gate electrode 26, an accumulation layer is induced in a surface layer of the n channel region 30 right under the gate insulating film 25, so that current flows between a source electrode 27 deposited on an n+ source region 23, and a drain electrode 28 deposited on the rear surface of an n+ drain region 24. When the voltage to the gate electrode 26 is removed, the accumulation layer right under the gate insulating film 25 disappears, and a depletion layer spreads out, thus blocking current flow through the accumulation layer. The ACCUFET using 6H—SiC as a semiconductor material provides an electron mobility of 81 $cm^2$/V.s.

FIG. 12 is a cross-sectional view showing a part of another example of ACCUFET proposed by Hara (refer to Hara, K.: Materials Science Form Vols. 264–268 (1988) p.901). This example is a UMOSFET having a trench structure, and basically identical with the ACCUFET of FIG. 11 as described above. In this example, too, an n channel region 40 in the form of an n type epitaxial layer is formed in the surface of the SiC substrate, to provide an accumulator layer. Upon application of a positive voltage to a gate electrode 36, an accumulation layer is induced in the n channel region 40, so that current flows between a source electrode 37 that contacts with an n+ source region 33, and a drain electrode 38 deposited on the rear surface of an n+ drain region 34.

The ACCUFET of FIG. 11 and the UMOSFET of FIG. 12, however, are typically depletion type (normally-on type) transistors in which current flows even when no voltage (0V) is applied to the gate electrode 26, 36. It is thus difficult to produce the above transistors to be of enhancement type (normally-off type), due to restrictions imposed on the structures of the devices.

SUMMARY OF THE INVENTION

It is therefore an object of the present invention to provide an normally-off type or enhancement type SiC MOS semiconductor device which has a high electron mobility of a channel region to assure a low ON-state resistance, and which can be easily manufactured. It is another object to provide a method for manufacturing such SiC MOS semiconductor devices.

To accomplish the above object, the present invention provides a silicon carbide n channel MOS semiconductor device, comprising: a semiconductor substrate comprising silicon carbide, the substrate including a p base region, an $n^+$ source region and an $n^+$ drain region; a gate insulating film formed on a surface of the p base region; a gate electrode provided on the gate insulating film; and first and second main electrodes that allow current to flow therebetween; wherein current flowing between the first and second main electrodes is controlled by controlling an electron concentration of an inversion layer that is induced in a surface layer of the p base region located under the gate insulating film when a positive voltage is applied to the gate electrode; and wherein the effective acceptor concentration in the vicinity of an interface between the p base region and the gate insulating film is in a range of $1\times10^{13}$ to $1\times10^{16}$ cm$^{-3}$.

In the course of studies on silicon carbide MOSFET, the inventor of the present invention found that the electron mobility of a channel region can be improved by forming a low-concentration region in a surface layer of a semiconductor substrate of the n channel MOSFET.

FIG. 2 is a graph showing results of experiments conducted on silicon carbide n channel MOSFET, more specifically, the dependence of the acceptor concentration of a p base region on the mobility of the channel region. In FIG. 2, the horizontal axis indicates the acceptor concentration on a logarithm scale, and the vertical indicates the mobility of the inversion layer, with respect to two crystalline forms (6H—SiC and 4H—SiC) of silicon carbide.

It will be understood from FIG. 2 that the mobility is greatly dependent upon the acceptor concentration, namely, the mobility decreases as the acceptor concentration increases. Where the acceptor concentration is $1\times10^{16}$ cm$^{-3}$ or lower, for example, the 6H—SiC device provides a mobility of 80 cm$^2$V.s or higher, and the 4H—SiC device provides a mobility of 30 cm$^2$V.s or higher.

While no data is shown for the acceptor concentration of $1\times10^{14}$ cm$^{-3}$ or lower, the mobility is supposed to be saturated or maintained at a high level in the range lower than $1\times10^{14}$ cm$^{-3}$. So far, no method is available for realizing the impurity concentration of less than $1\times10^{13}$ cm$^{-3}$ with sufficient stability.

If the entire p base region of the MOSFET is formed with a low concentration of $1\times10^{16}$ cm$^{-3}$ or lower, the resistance of the p base region is considerably increased, causing secondary problems such as latch-up. Such problems can be solved by forming only a surface layer of the p base region that is very close to the substrate surface with a low impurity concentration while forming the inner or deeper portion of the region with a high concentration.

Quantitatively, the total amount x per unit area of donor impurities introduced into the surface layer of the p base region is preferably controlled to be a range represented by:

$$1\times10^{11} \text{ cm}^{-2} < x < 5Q_B/q,$$

$$Q_B = (4\epsilon_o \epsilon_s \Phi_B N_A)^{1/2}$$

where $\epsilon_o$ is a dielectric constant in vacuum, $\epsilon_s$ is a dielectric constant of silicon carbide, $\Phi_B$ is an energy difference between an intrinsic Fermi level and a Fermi level of silicon carbide, $N_A$ is an acceptor concentration of the p base region before implantation of donor ions, and q is an intrinsic charge. With the amount of impurities thus controlled, a sufficiently large mobility can be obtained in an inversion layer of the MOSFET, as described later in some embodiments of the invention.

The present invention also provides a method for manufacturing such a silicon carbide n channel MOS semiconductor device as described above, wherein current flowing between the two main electrodes is controlled by controlling an electron concentration of an inversion layer that is induced in a surface layer of the p base region under the gate insulating film upon application of a positive voltage to the gate electrode, and wherein the effective acceptor concentration of the p base region in the vicinity of the interface between the p base region and the gate insulating film is controlled to be in a range of $1\times10^{13}$ to $1\times10^{16}$ cm$^{-3}$. In the manufacturing method of the invention, the acceptor concentration of the surface layer of the p base region is made lower than that of the inner or deeper part of the p base region by controlling the acceleration voltage and dose amount during ion implantation for forming the surface layer of the p base region, or implanting ions of donor impurities into a surface layer of the p base region, or forming a low-concentration layer by epitaxial growth as a surface layer of the p base region so that the acceptor concentration of the epitaxial layer becomes lower than that of the inner portion of the p base region.

Where ions of the donor impurities are implanted into the surface layer of the p base region, the dose amount x is preferably controlled to be in a range represented by:

$$1\times10^{11} \text{ cm}^{-2} < x < 5Q_B/q,$$

$$Q_B = (4\epsilon_o \epsilon_s \Phi_B N_A)^{1/2}$$

where $\epsilon_o$, $\epsilon_s$, $\Phi_B$, $N_A$, and q are the same as those as indicated above. With the dose amount thus controlled, the inversion layer achieves a sufficiently high mobility, as described later in the embodiments of the invention.

The donor impurities as indicated above may be nitrogen or phosphorous.

The manufacturing method may further include a step of conducting heat treatment for activating the impurities introduced by ion implantation. In particular, the heat treatment is preferably conducted at a temperature of 1000 to 1500° C. In this case, the activation rate of the impurities introduced through ion implantation is increased, making it possible to reduce the amount of ions to be implanted.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

Figure 10:
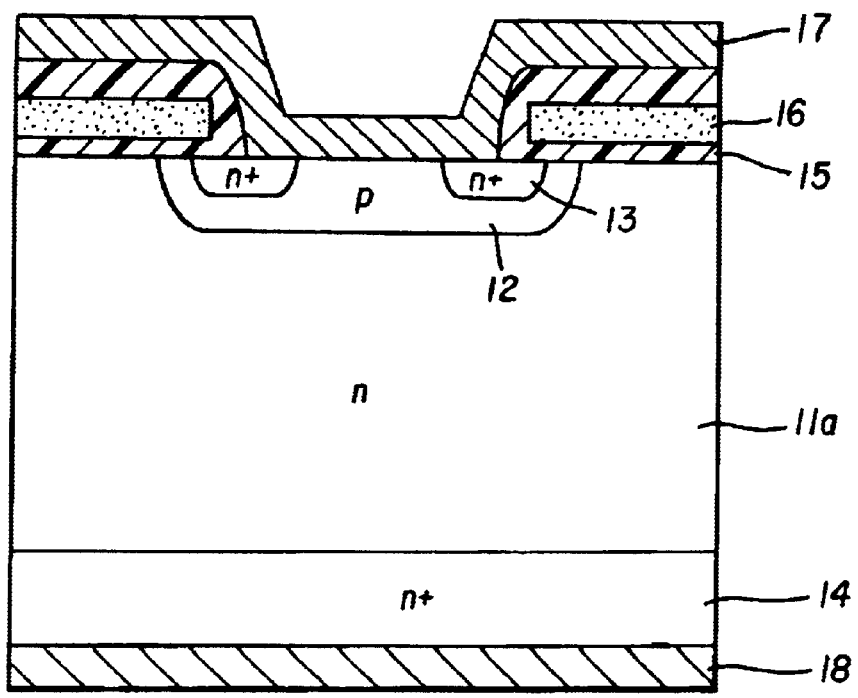
FIG. 10 is a cross-sectional view showing a part of a known vertical MOSFET.
Figure 11:
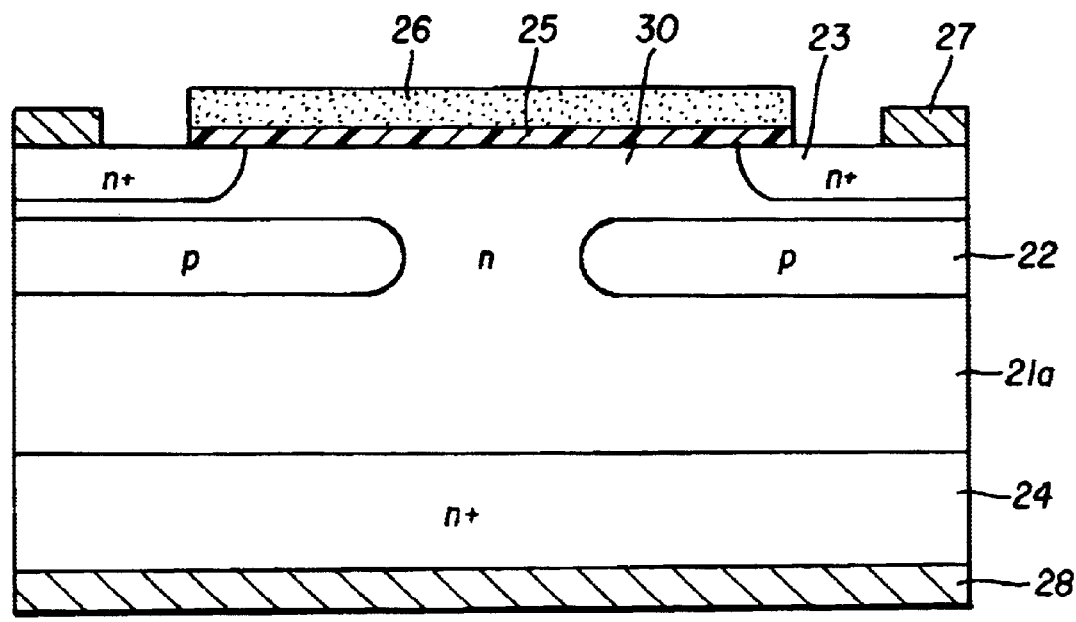
FIG. 11 is a cross-sectional view showing a planar type ACCUFET (accumulation type MOSFET)
Figure 12:
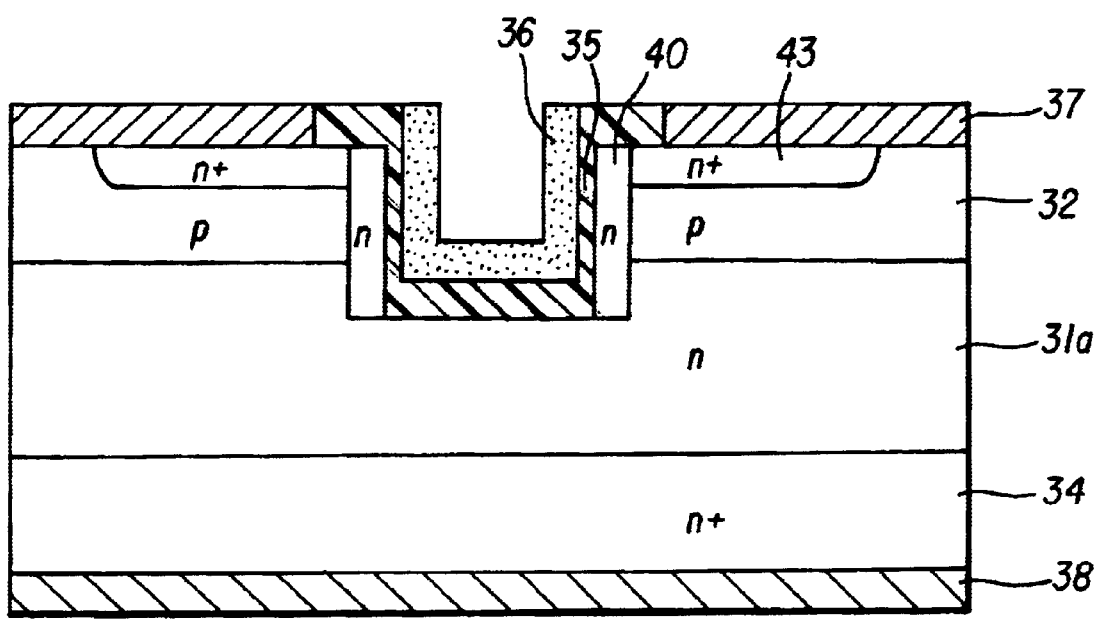
FIG. 12 is a cross-sectional view showing a trench type ACCUFET (accumulation type MOSFET).

Some preferred embodiments of the present invention will be described in detail, though no detailed description will be provided with respect to such portions that are identical with those of the known example of FIGS. 10–12, or not related to the principle of the present invention.

First Embodiment

Figure 1A:
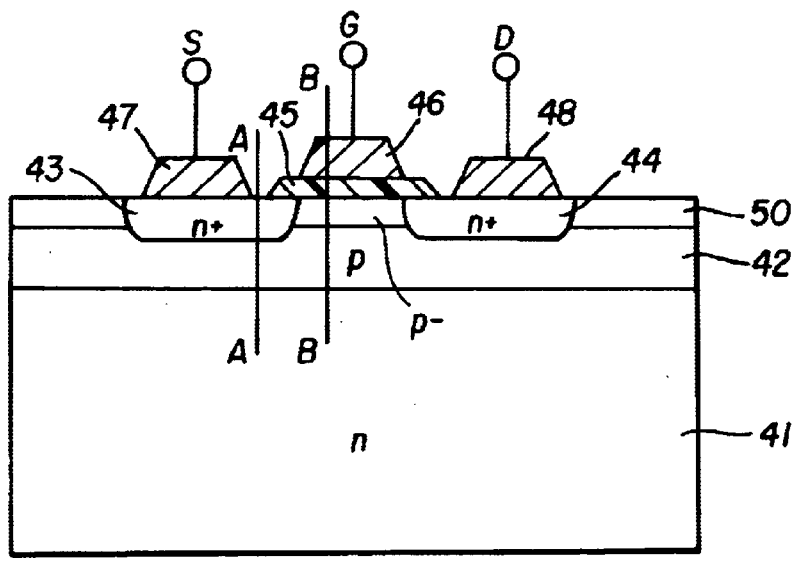
FIG. 1(a) is a cross-sectional view of a lateral MOSFET according to the first embodiment of the present invention.

FIG. 1(a) is a cross-sectional view of a SiC lateral n-channel MOSFET constructed according to the first embodiment of the present invention. In the MOSFET of FIG. 1(a), a p base region 42 and a p⁻ channel region 50 having a lower impurity concentration than the p base region 42 are formed in a surface layer of a SiC substrate 41, and an n⁺ source region 43 and an n⁺ drain region 44 are formed in the p base region 42. A gate electrode 46 is formed on a gate insulating layer 45, over a surface of the p⁻ channel region 50 that is interposed between the n⁺ source region 43 and the n⁺ drain region 44. Also, a source electrode 47 is formed in contact with the n⁺ source region 43, and a drain electrode 48 is formed in contact with the n⁺ drain region 44.

Figure 1B:
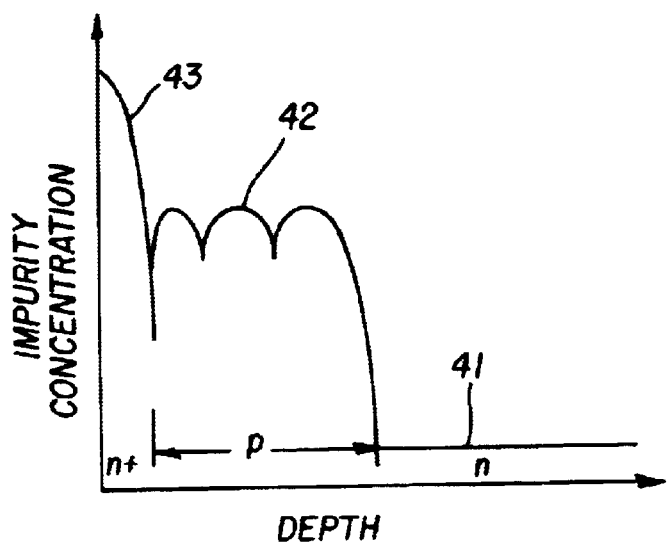
FIG. 1(b) is a graph showing the distribution of the impurity concentration in a cross section taken along line A—A of FIG. 1(a)
Figure 1C:
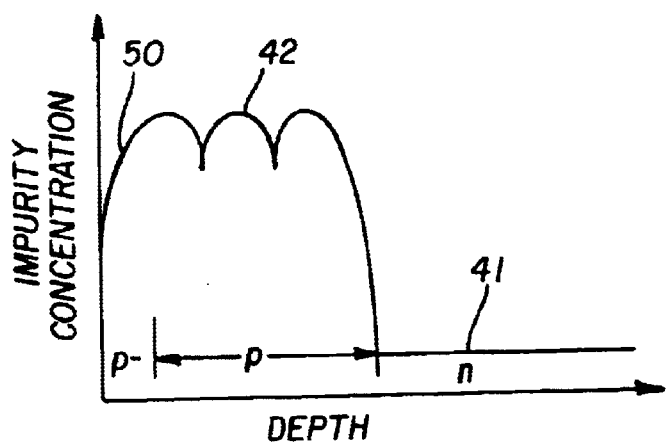
FIG. 1(c) is a graph showing the distribution of the impurity concentration in a cross section taken along line B—B of FIG. 1(a)
Figure 2:
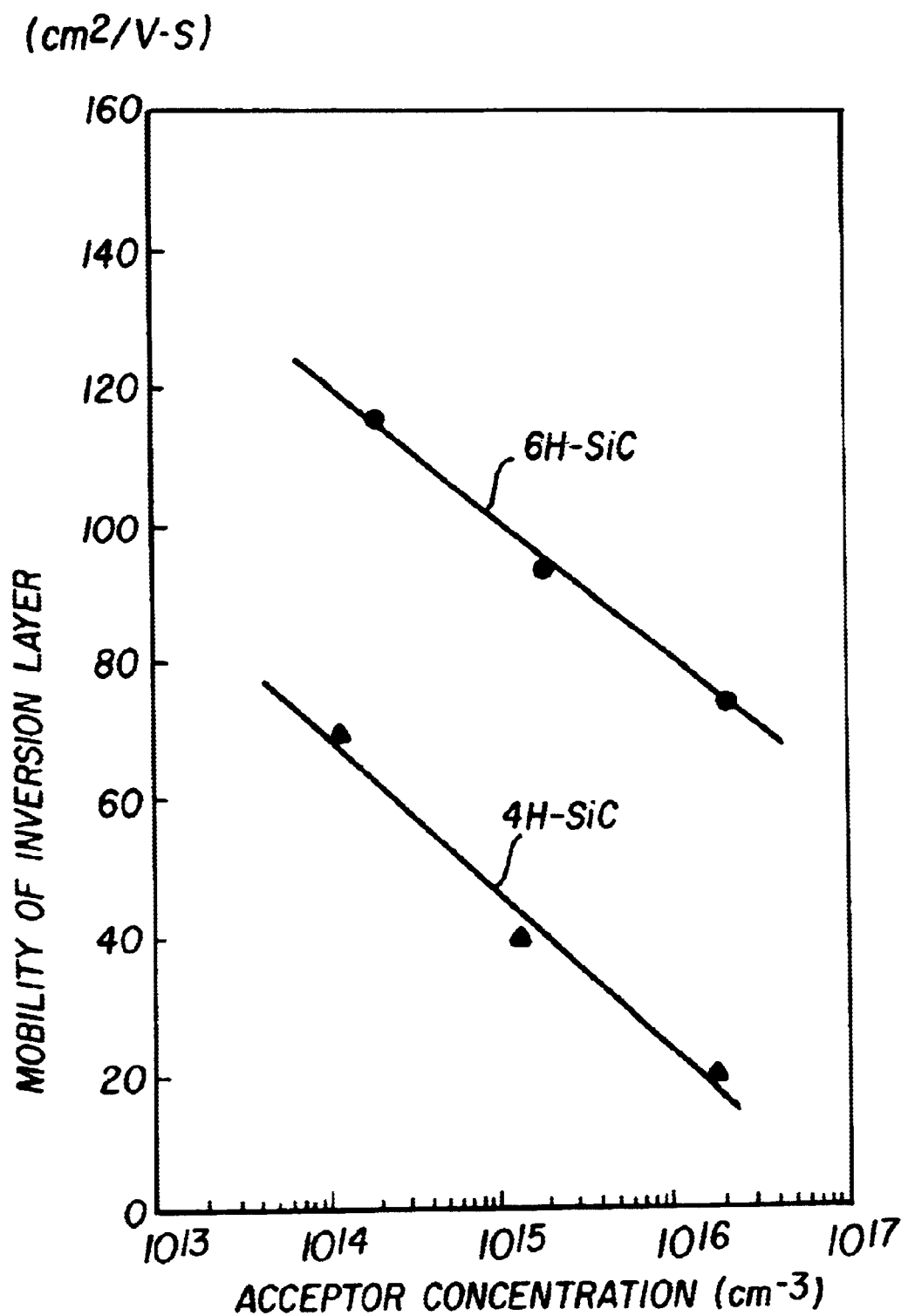
FIG. 2 is a graph showing the relationship between the mobility of an inversion layer and the acceptor concentration of a substrate surface in each of two types of silicon carbide MOSFETs.

FIG. 1(b) shows the distribution of the impurity concentration in a cross section taken along line A—A of FIG. 1(a), and FIG. 1(c) shows the distribution of the impurity concentration in a cross section taken along line B—B of FIG. 1(a). In FIG. 1(b), an impurity profile of the p base region 42 is seen below that of the n⁺ source region 43. The surface concentration of the n⁺ source region 43 is $1\times10^{20}$ cm$^{-3}$, and the maximum impurity concentration of the p base region 42 is $1\times10^{17}$ cm$^{-3}$. The depth of the junction between the n⁺ source region 43 and the p base region 42 is 0.3 $\mu$m, and the depth of the junction between the p base region 42 and the n type substrate 41 is 1.0 $\mu$m. The distribution of the impurity concentration as shown in FIG. 1(b) is also observed in conventional lateral MOSFETs.

The SiC lateral MOSFET of the present embodiment is different from the known SiC lateral MOSFET in that the p⁻ channel region 50 having a surface concentration of $1\times10^{15}$ cm$^{-3}$ is provided in a surface layer of the SiC substrate, and the p base region 42 having a relatively high concentration of $1\times10^{17}$ cm$^{-3}$ is formed in a deeper portion of the p⁻ channel region 50, as shown in FIG. 1(c). For example, the p base region 42, n⁺ source region 43, and the n⁺ drain region 44 are formed in the shape of strips as viewed in a plane perpendicular to the thickness of the substrate, and the width of each of the n⁺ source region 43 and the n⁺ drain region 44 is about 2 $\mu$m, and the distance between these regions 43, 44 is about 1 $\mu$m. The profile or distribution of the impurity concentration may be changed by suitably controlling the acceleration voltage and dose amount during ion implantation, for example. What is important in the present embodiment is that the peak of the concentration profile is present inside the substrate, and the surface of the substrate has a relatively low impurity concentration.

The operation of the lateral MOSFET of the first embodiment is basically the same as that of the known MOSFETs. Upon application of a positive voltage to the gate electrode 46, an inversion layer appears in a surface layer of the p base region 42, so that current flows between the drain electrode 48 and the source electrode 47. If the positive voltage to the gate electrode 46 is removed, the inversion layer disappears, thus blocking current flow between the drain and source electrodes.

In the lateral n channel MOSFET of the first embodiment, the inversion layer showed an electron mobility of about 50 cm$^2$/V.s. This value is twice or higher the maximum value of the mobility of known 4H—SiC devices. As a result, the ON-state resistance of the present n channel MOSFET was about one third of that of a comparative example in which no p⁻ channel region 50 was not provided. These effects or advantages are attributed to the provision of the p⁻ channel region 50.

FIG. 3(a) through FIG. 3(e) are cross-sectional views showing the vicinity of the surface of the semiconductor substrate in the order of process steps, which views are useful in explaining a method for manufacturing the SiC lateral MOSFET of the present embodiment of FIG. 1.

Figure 3A:
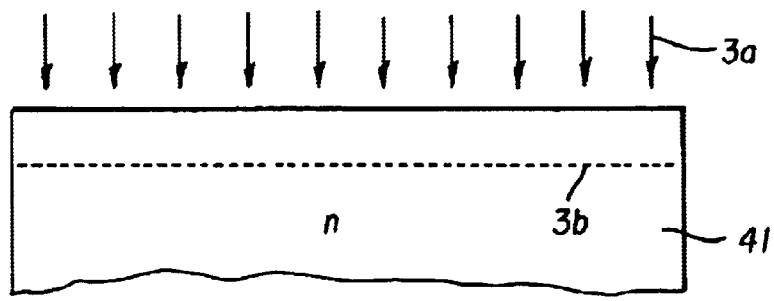
FIG. 3(a) through FIG. 3(e) are cross-sectional views showing the process steps for manufacturing the lateral MOSFET of the first embodiment of FIG. 1.

Initially, an n-type 4H—SiC substrate 41 having an impurity concentration of $1\times10^{15}$ cm$^{-3}$ and a thickness of 350 $\mu$m is prepared, and aluminum (Al) ions 3a for forming the p⁻ channel region 50 and p base region 42 are implanted in the surface of the SiC substrate 41 at a high temperature of about 1000° C., as shown in FIG. 3(a) in which reference numeral 3b denotes aluminum (Al) atoms thus introduced. Here, multiple implantation is performed at an acceleration voltage of 30 keV to 500 keV, and the total dose amount is $1\times10^{14}$ to $5\times10^{15}$ cm$^{-2}$. Preferably, a relatively small amount of ions are implanted at 30 keV, so as not to increase the surface impurity concentration of the p⁻ channel region 50. Boron (B) ions may be implanted as acceptor impurities, instead of aluminum (Al) ions. Although the implantation may be carried out at room temperature, it is desirable to implant the ions at a high temperature for improvement of the activation rate of the implanted ions.

Figure 3B:
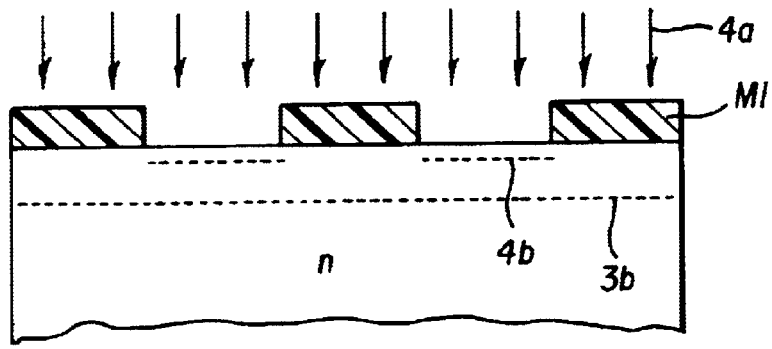

In the next step of FIG. 3(b), an SiO$_2$ film is formed by conducting thermal oxidation at 1100° C. for five hours by a pyrogenic method, and patterned by photolithography so as to provide a mask M1. With the mask M1 thus placed on the substrate surface, nitrogen (N) ions 4a for forming the n$^+$ source region 43 and n$^+$ drain region 44 are implanted at a high temperature of about 1000° C. In FIG. 3(b), reference numeral 4b denotes nitrogen atoms thus implanted. In this step, multiple implantation is performed at an acceleration voltage of 10 to 100 keV, and the total dose amount is controlled to $1\times10^{14}$ to $5\times10^{15}$ cm$^{-2}$. Phosphorous (P) ions may be implanted as donor impurities, instead of nitrogen (N) ions.

Figure 3C:
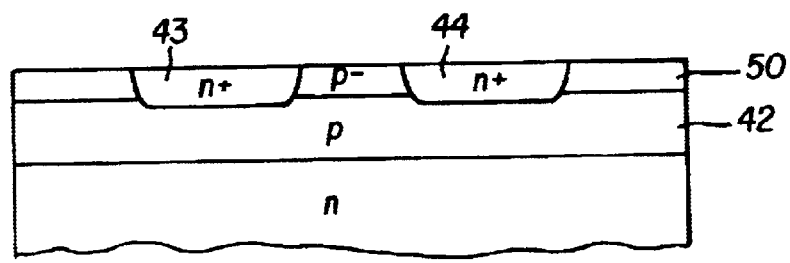

Subsequently, the mask M1 formed from the SiO$_2$ film is removed, and heat treatment is carried out at 1650° C. for one hour, so as to activate the impurities implanted. As a result, the p$^-$ channel region 50, p base region 42, n$^+$ source region 43, and the n$^+$ drain region 44 are respectively formed, as shown in FIG. 3(c). Although the impurities hardly diffuse in the SiC substrate, the depth to which each impurity region is formed can be controlled by suitably adjusting the acceleration voltage during the ion implantation. For example, the p base region 42 is formed with a junction depth of about 1.0 $\mu$m, by setting the maximum acceleration voltage to as high as 500 keV. While the junction depth of the n$^+$ source region 43 and n$^+$ drain region 44 is 0.3 $\mu$m, the larger depth may be achieved by further increasing the acceleration voltage.

Figure 3D:
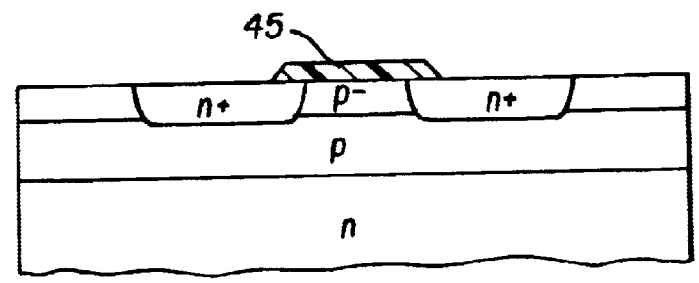

In the next step of FIG. 3(d), an SiO$_2$ film having a thickness of 30 nm is formed through thermal oxidation conducted at 1100° C. for five hours by a pyrogenic method, and patterned by photolithography to thus form the gate insulating film 45.

Figure 3E:
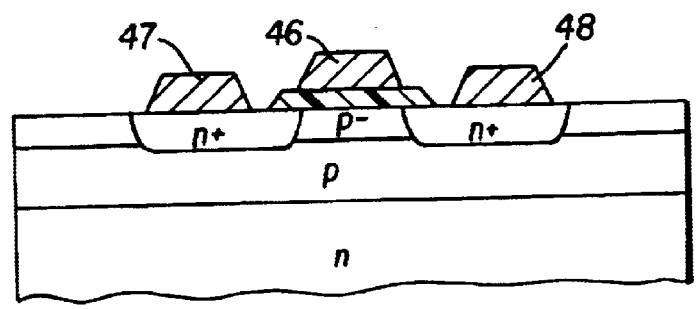

After boron/phosphorous/silica glass (BPSG) is deposited on the structure of FIG. 3(d) by low-pressure CVD method, contact holes are formed by patterning the deposited film, and an aluminum alloy film is formed by sputtering, and patterned into the gate electrode 46, source electrode 47 and drain electrode 48, as shown in FIG. 3(e). The gate electrode 46 may be formed of polysilicon.

With the manufacturing method as described above, the SiC lateral MOSFET having low ON-state resistance and a high mobility of electrons in the inversion layer can be easily produced without requiring considerably accurate control of the impurity concentration and thickness as in the known ACCUFET.

Second Embodiment

FIG. 4(a) through FIG. 4(e) are cross-sectional views showing the vicinity of the surface of the semiconductor substrate in the order of process steps, which views are useful in explaining another method for manufacturing a SiC lateral MOSFET according to the second embodiment of the present invention.

Figure 4A:
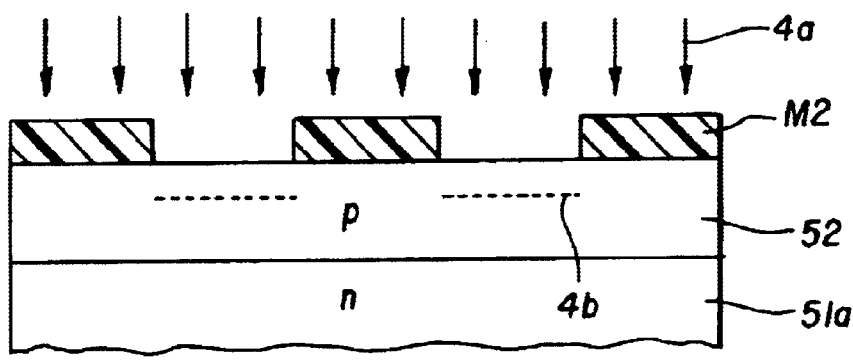
FIG. 4(a) through FIG. 4(c) are cross-sectional views showing the process steps for manufacturing a lateral MOSFET according to the second embodiment of the present invention.

Initially, a p base region 52 having an acceptor concentration of $1\times10^{17}$ cm$^{-3}$ and a thickness of 2 $\mu$m is epitaxially grown on an n drift layer 51a having an impurity concentration of $1\times10^{16}$ cm$^{-3}$ and a thickness of 350 $\mu$m, to provide a 4H—SiC substrate 51. After an SiO$_2$ film is formed on the surface of the SiC substrate, and patterned by photolithography into a mask M2, nitrogen (N) ions 4a for forming n$^+$ source region 53 and n$^+$ drain region 54 are implanted at a high temperature of about 1000° C., as shown in FIG. 4(a) in which reference numeral 4b denotes nitrogen (N) atoms thus implanted. In this step, multiple implantation is performed at an acceleration voltage of 10 keV to 100 keV, and the total dose amount is $1\times10^{14}$ to $5\times10^{15}$ cm$^{-2}$. Although the implantation may be carried out at room temperature, it is desirable to implant the above ions at a high temperature for improvement of the activation rate of the implanted ions.

Figure 4B:
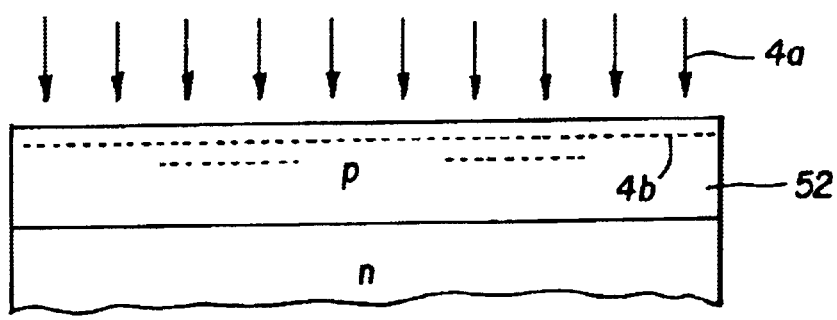

Subsequently, nitrogen (N) ions 4a for forming a low-concentration p$^-$ channel region 60 are implanted, as shown in FIG. 4(b) in which reference numeral 4b denotes nitrogen (N) atoms thus implanted. In this step, multiple implantation is performed at an acceleration voltage of 10 keV to 50 keV, and the total dose amount is controlled to $1\times10^{11}$ to $5\times10^{12}$ cm$^{-2}$. Here, it is important to control the dose amount so as to achieve a surface concentration of $1\times10^{16}$ cm$^{-3}$ or smaller and not to form an n type region that will not be depleted with zero bias or voltage applied to the gate electrode, when the ions are activated in subsequent heat treatment.

Figure 4C:
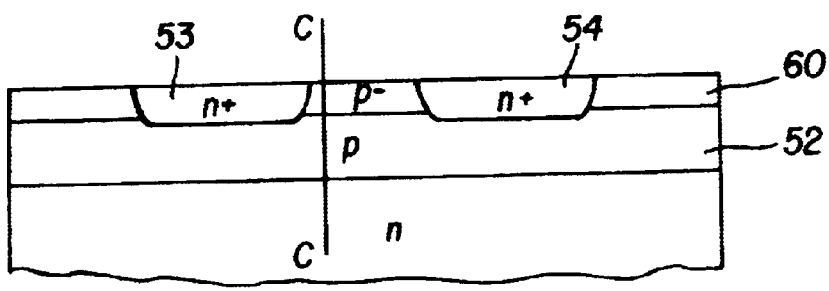

In the next step of FIG. 4(c), the mask M2 formed from the SiO$_2$ film is removed, and heat treatment is carried out at 1650° C. for one hour, so as to activate the donor impurities implanted. As a result, the p$^-$ channel region 60, p base region 52 n$^+$ source region 53, and the n$^+$ drain region 54 are respectively formed, as shown in FIG. 4(c).

Figure 4D:
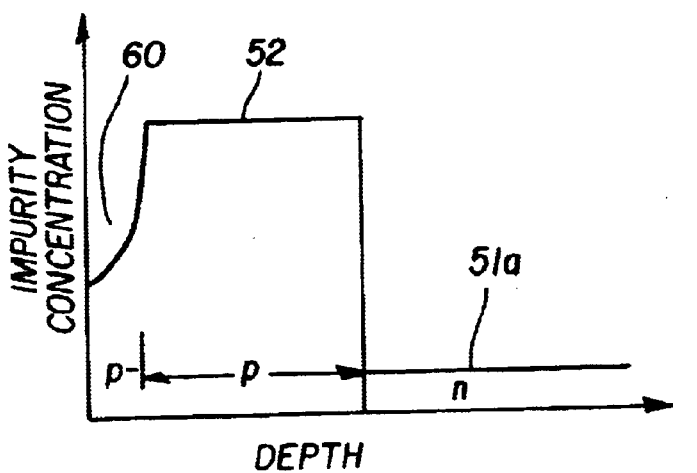
FIG. 4(d) is a graph showing the distribution of the impurity concentration in a cross section taken along line C—C of FIG. 4(c)

FIG. 4(d) shows the distribution of the impurity concentration in a cross section taken along line C—C of FIG. 4(c). In FIG. 4(d), the p$^-$ channel region 60 has a surface concentration of $1\times10^{15}$ cm$^{-3}$, and the p base region 52 located below the channel region 60 has a substantially uniform acceptor concentration (N$_A$) of $1\times10^{17}$ cm$^{-3}$ since the base region 52 is formed by epitaxial growth. For example, the p base region 52, n$^+$ source region 53 and n$^+$ drain region 54 are formed in the shape of strips as viewed in a plane perpendicular to the thickness of the SiC substrate.

Following the step of 4(c), similar steps to FIGS. 3(d) and 3(e) are executed to produce a lateral MOSFET.

Figure 5:
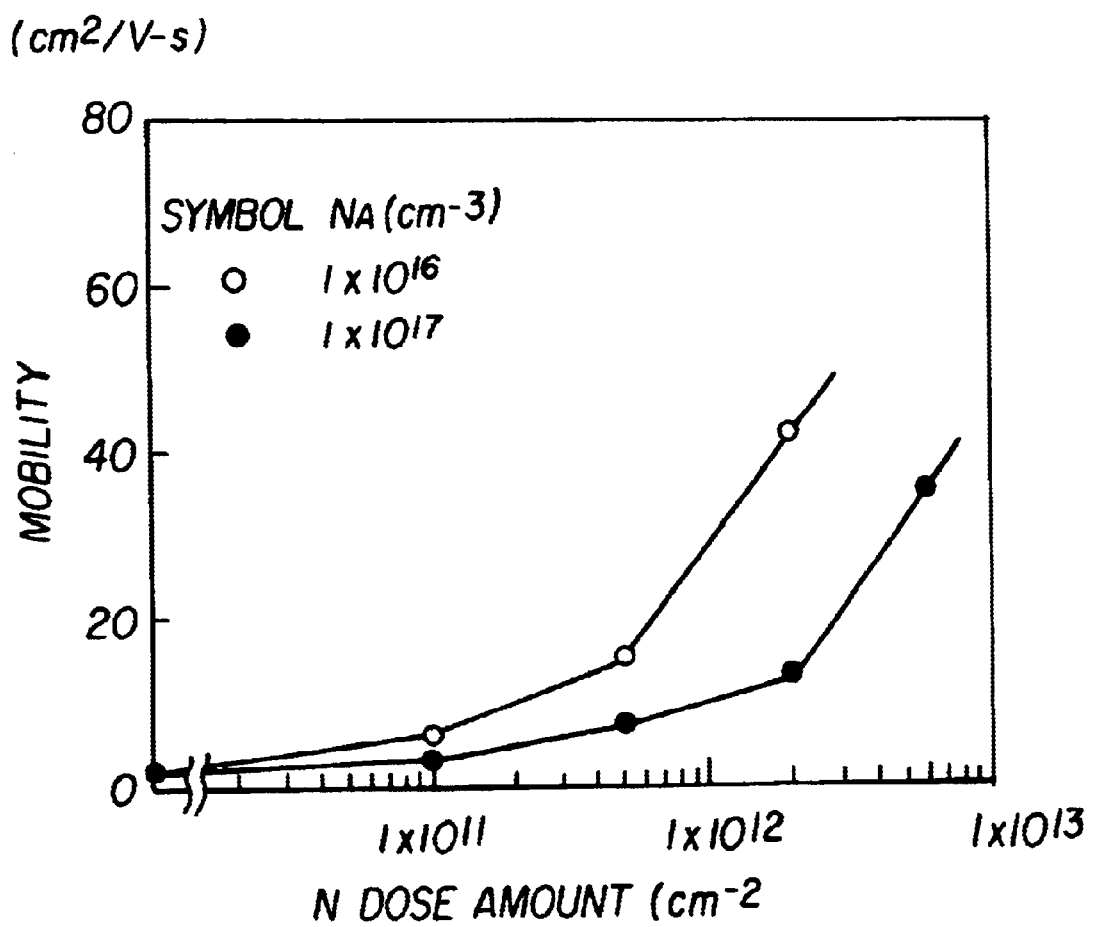
FIG. 5 is a graph showing the relationship between the MOS mobility and the dose amount of nitrogen.

FIG. 5 is a graph showing the dependence of the electron mobility of the inversion layer upon the N (nitrogen) dose amount in the MOSFET of the second embodiment. In FIG. 5, the horizontal axis indicates the N dose amount on a logarithm scale, and the vertical axis indicates the mobility of the inversion layer.

It is understood from FIG. 5 that the mobility of the inversion layer is greatly dependent upon the dose amount, and that the mobility increases with an increase in the N dose amount. FIG. 5 also shows the case where the impurity concentration of the p base region 52 is $1\times10^{16}$ cm$^{-3}$, in which case a similar tendency is observed, and the larger mobility is obtained with the lower dose amount.

A reason for such a significant improvement in the electron mobility will be now explained.

Figure 6A:
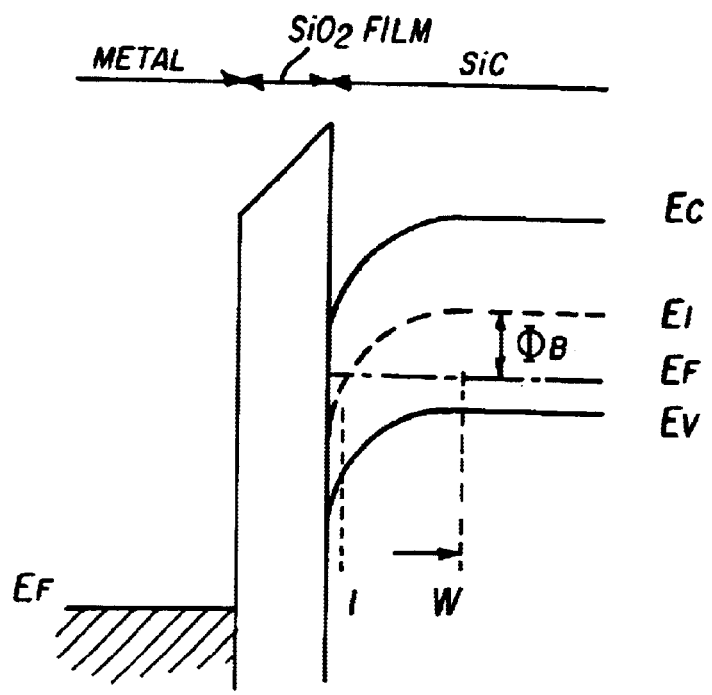
FIG. 6(a), FIG. 6(b) and FIG. 6(c) are diagrams showing the energy band, charge distribution, and the electric field distribution, respectively, when a bias voltage is applied to a gate of a known silicon carbide MOSFET.
Figure 6B:
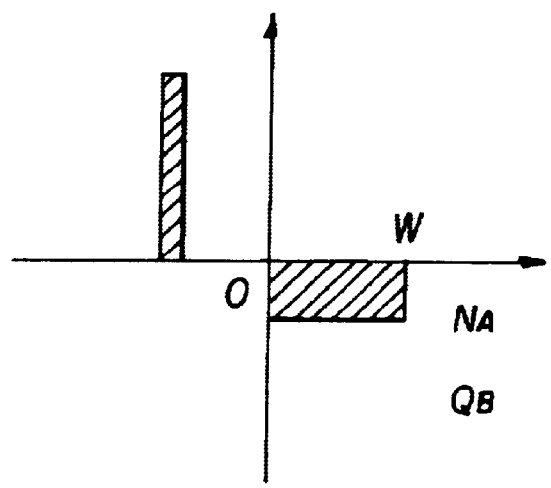
Figure 6C:
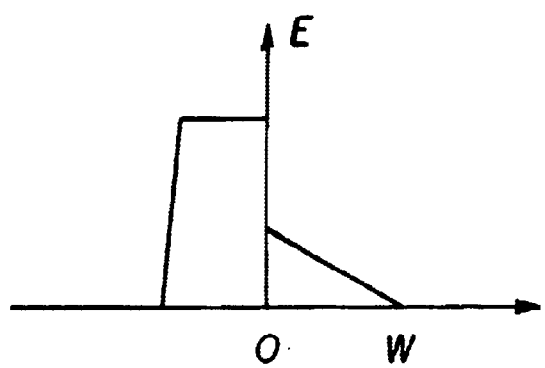

First, the case where no donor impurities are implanted will be considered. FIGS. 6(a), 6(b) and 6(c) are diagrams showing the energy band, charge distribution and electric field distribution, respectively, when a voltage is applied to the gate electrode to form an inversion layer in a surface layer of the SiC substrate right under the SiO$_2$ film. In FIG. 6(a), "Ec" is the lower end of the conduction band, "Ev" is the upper end of the valence band, "$E_F$" is the Fermi level, and "Ei" is the intrinsic Fermi level, and "$\Phi_B$" is an energy difference (product of the potential difference and the intrinsic charge) between the Fermi level $E_F$ and the intrinsic Fermi level Ei. In FIGS. 6(a)–6(c), "I" denotes an inversion layer, "W" denotes a depletion layer, and "$N_A$" represents the acceptor concentration.

What is to be especially noted is that SiC has a far larger band gap as compared with Si. For this reason, a high level of voltage must be applied to the gate electrode so as to produce an inversion layer. This means the necessity to bend the energy band by a large degree, which requires a considerably large electric field to be produced at the interface between the $SiO_2$ film and the SiC surface. With a sufficiently high voltage being applied to the gate electrode, electrons attracted to the vicinity of the $SiO_2$ film–SiC interface provide an inversion layer that allows current to flow therethrough. If such a large electric field as described above is present at the interface, however, the electrons are strongly forced against the $SiO_2$ film, and tend to be scattered even with slight non-uniformity on the substrate surface, thus giving rise to large resistance.

In the state in which the energy band is bent by a large degree, a large amount of acceptors are present in the form of ions in the depletion layer on the side of the SiC substrate. Accordingly, the electrons in the inversion layer are subjected to Coulomb scattering due to these ionized acceptors. For the above reasons, the electron mobility in the SiC substrate is far lower than that in a Si device.

Figure 7A:
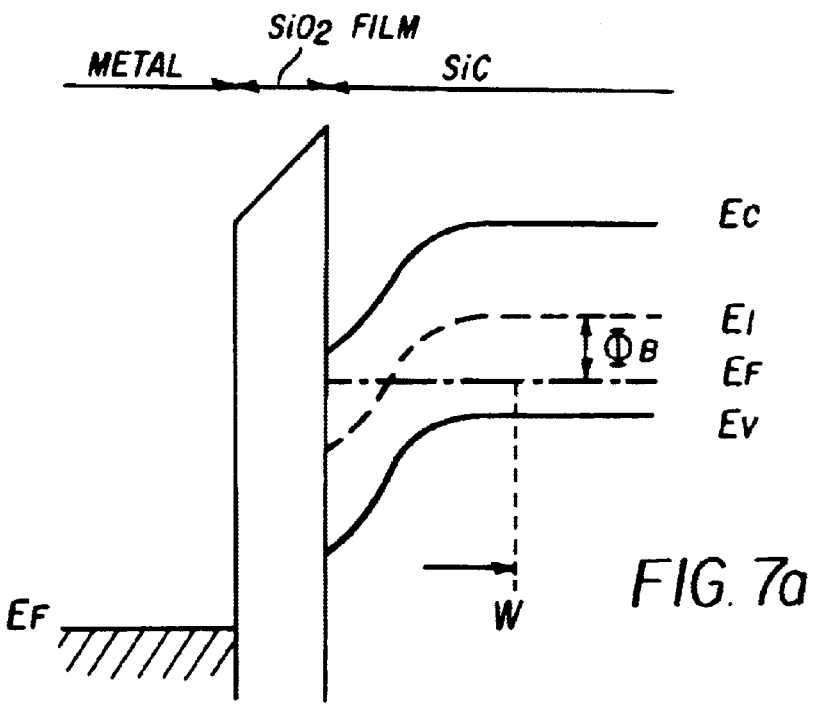
FIG. 7(a), FIG. 7(b) and FIG. 7(c) are diagrams showing the energy band, charge distribution, and the electric field distribution, respectively, when a bias voltage is applied to the gate of the silicon carbide MOSFET of the present invention.
Figure 7B:
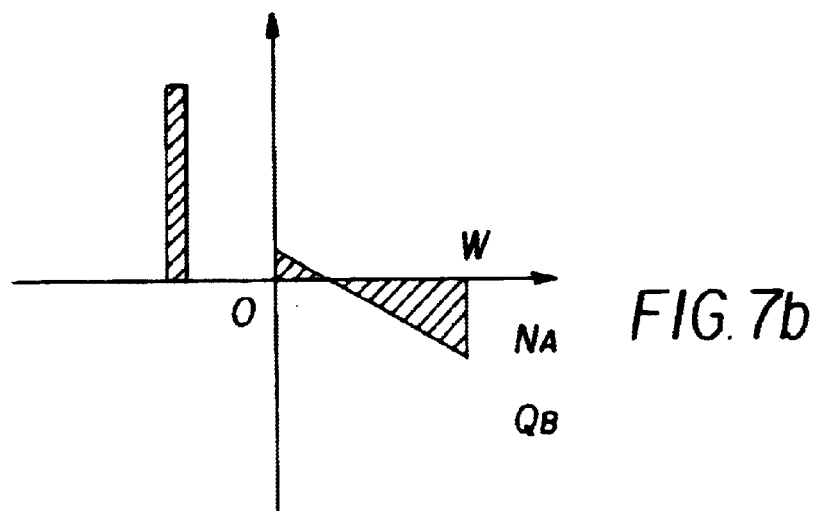
Figure 7C:
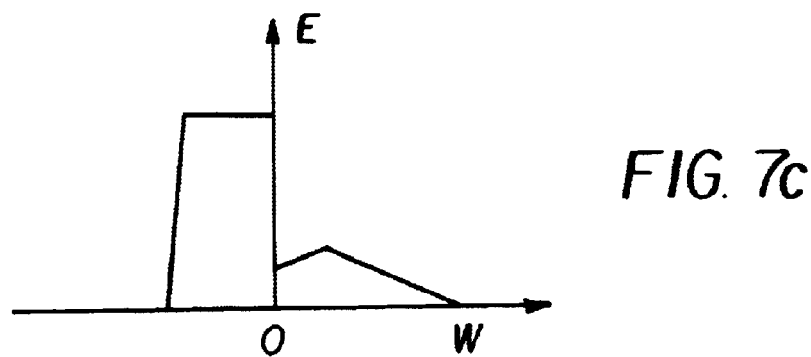

According to the present invention, on the other hand, donor impurities, such as nitrogen (N) or phosphorous (P) ions, whose polarity is opposite to that of the acceptors in the substrate surface layer are introduced in a very surface layer of the SiC substrate, and activated through heat treatment. In the present embodiment, nitrogen (N) ions are implanted. FIGS. 7(a), 7(b) and 7(c) are diagrams showing the energy band, charge distribution, and electric field distribution diagram, respectively, in the case of the present embodiment.

More specifically described, the ionized acceptors in the depletion layer of the p base region of the substrate cancel out the donors introduced into the substrate surface, and therefore the width of the depletion layer is increased, resulting in a reduced electric field strength. FIG. 7(b) illustrates a somewhat extreme example in which the donors introduced into the substrate surface outnumbers the acceptors in the p base region. Thus, the number of donors in the surface layer may be larger than that of the acceptors in the p base region provided the surface layer is depleted with zero bias, namely, when no voltage is applied to the gate electrode. In this case, the donor ions that outnumbers the acceptors are present in the surface layer adjacent to the substrate surface, and acceptor ions are present in a deeper portion of the substrate.

In the case as described above, the peak of the electric field shifts to a part of the SiC substrate that is located slightly inwardly of the substrate surface, as shown in FIG. 7(c). This leads to a reduction in the electric field appearing in the vicinity of the interface between the $SiO_2$ film and the SiC in which electrons contributing to conduction are present. Also, lines of electric force that extend from the ionized acceptors mostly end at the donors introduced into the surface layer, and therefore conduction electrons are not influenced by large Coulomb force.

The above discussion rationalizes the result of FIG. 5. Next, the amount of the donor impurities to be implanted is set in the manner as described below. The following expression (3) approximately represents the total charge amount $Q_B$ in the depletion layer on the side of the SiC substrate under conditions where an inversion layer is formed.

$$i\ Q_B = (4 \in_o \in_s \Phi_B N_A)^{1/2} \quad (3)$$

where $\in_o$ is the dielectric constant in vacuum, $\in_s$ is the dielectric constant of SiC, $N_A$ is the acceptor concentration in the surface of the p base region before ion implantation, and $\Phi_B$ is parameter as indicated in FIG. 6(a). It will be understood from FIG. 6(a) that the value $\Phi_B$ varies depending upon the acceptor concentration or the temperature, but is slightly smaller than the band gap. For example, ΦB is equal to about 1V at room temperature where the acceptor concentration is $1 \times 10^{16}$ $cm^3$.

The total charge amount $Q_B$ calculated under the above conditions is $7.5 \times 10^{-8}$ C. $cm^{-2}$, which may be converted into a dose amount of about $5 \times 10^{11}$ $cm^{-2}$. This value is very close to that of the example of FIG. 1. Namely, the result of FIG. 5 showing remarkable improved mobility in a region around the value $Q_B$ thus obtained justifies the above discussion with reference to FIGS. 6(a)–7(c). It is understood from FIG. 5 that the advantageous effect of the present invention is observed in the region around this value.

The lower limit of the ion implantation in practical applications is about $1 \times 10^{11}$ $cm^{-2}$. If an excessively large amount of donor impurities are introduced, on the other hand, an n-type conductive layer (that is not depleted with zero bias) is formed in a surface layer of the SiC substrate, and the source and drain are short-circuited. Thus, the amount of donor impurities must be controlled to an appropriate value so as to avoid the formation of the n-type conductive layer. The upper limit may be about five times that calculated according to the above-indicated equation (3). It is, however, to be noted that the above discussion is based on the assumption that 100% of the impurities introduced by ion implantation will be activated. Where part of the impurities fail to serve as donors because of a low activation temperature, therefore, a larger amount of donor impurities than that theoretically obtained need to be introduced. The practical annealing temperature is in the range of about 1100° C. to 1400° C., in which range the activation rate of nitrogen or phosphorous is expected to be about 10 to 100%. The amount of donor impurities need to be determined in view of these conditions.

As described above, the donor impurities such as phosphorous (P) or nitrogen (N) are implanted in the form of ions in the p-type semiconductor region, so that the effective acceptor concentration is reduced at around the surface of the SiC substrate. The n channel MOSFET produced by this method provides an ON-state resistance that is equivalent to that obtained in the first embodiment.

In the manufacturing method of the second embodiment, ion implantation of only the donor impurities, such as phosphorous (P) or nitrogen, is conducted. In the manufacturing method of the first embodiment in which ions of acceptor impurities, such as aluminum (Al) or boron (B), are implanted as well as the donor impurities, the heat treatment for activating the acceptor impurities needs to be conducted at a considerably high temperature, e.g., 1500° C. The method of the present embodiment is advantageous over that of the first embodiment in that the required activation temperature is about 1200° C., which is lower than that required for activating the acceptor impurities.

Third Embodiment

Figure 8A:
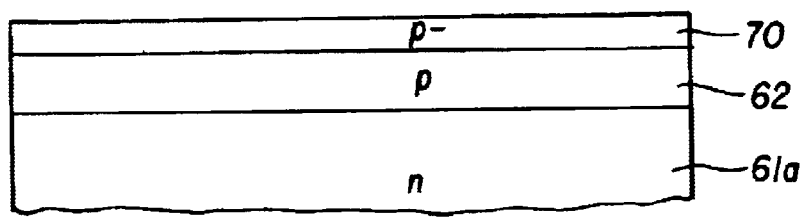
FIG. 8(a) through FIG. 8(c) are cross-sectional views showing the process steps for manufacturing a lateral MOSFET according to the third embodiment of the present invention.
Figure 8B:
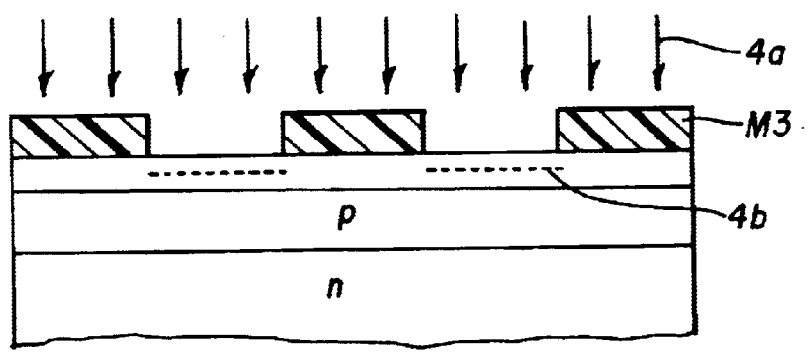
Figure 8C:
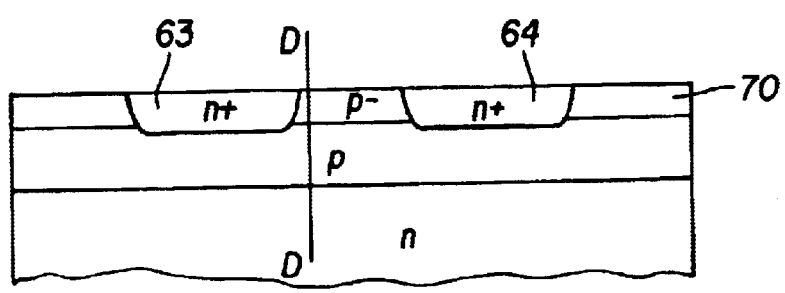

FIG. 8(a) through FIG. 8(c) are cross-sectional views showing the vicinity of the surface of the semiconductor substrate in the order of process steps, which views are useful in explaining a further method for manufacturing a SiC lateral MOSFET according to the third embodiment of the present invention.

Initially, a p base region 62 having an acceptor concentration of $1 \times 10^{17}$ $cm^{-3}$ and a thickness of 1 μm and a p⁻ channel region 70 having an acceptor concentration of $1 \times 10^{16}$ $cm^{-3}$ and a thickness of 0.1 μm are epitaxially grown on an n drift layer 61a having an impurity concentration of $1 \times 10^{16}$ $cm^{-3}$ and a thickness of 350 μm, to provide a 4H—SiC substrate, as shown in FIG. 8(a).

After an oxide film is formed on the surface of the SiC substrate, and patterned by photolithography into a mask M3, nitrogen (N) ions 4a for forming n$^+$ source region 63 and n$^+$ drain region 64 are implanted at a high temperature of about 1000° C., as shown in FIG. 4(b) in which reference numeral 4b denotes nitrogen (N) atoms thus implanted. In this step, multiple implantation is performed at an acceleration voltage of 10 keV to 100 keV, and the total dose amount is controlled to $1 \times 10^{14}$ to $5 \times 10^{15}$ $cm^{-2}$. Although the implantation may be carried out at room temperature, it is desirable to implant the above ions at a high temperature for improvement of the activation rate of the implanted ions.

Subsequently, the mask M3 formed from the oxide film is removed, and heat treatment is carried out at 1650° C. for one hour, so as to activate the donor impurities implanted. As a result, the n$^+$ source region 63 and the n$^+$ drain region 64 are respectively formed, as shown in FIG. 8(c).

Figure 8D:
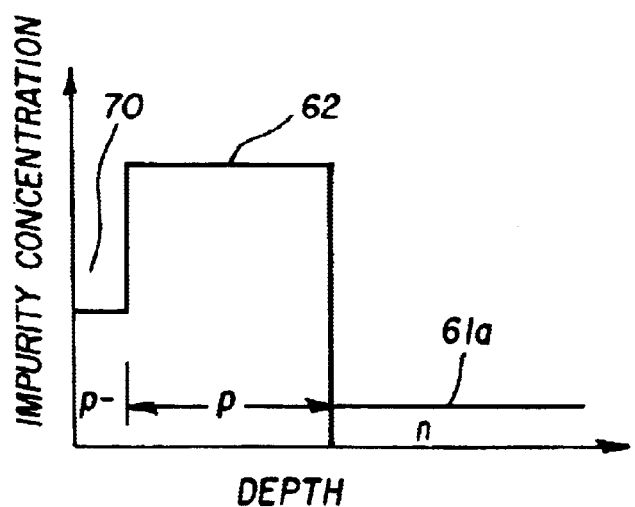
FIG. 8(d) is a graph showing the distribution of the impurity concentration in a cross section taken along line D—D of FIG. 8(c)

FIG. 8(d) shows the distribution of the impurity concentration in a cross section taken along line D—D of FIG. 8(c). In FIG. 8(d), the p$^-$ channel region 70 and p base region 62 have almost uniform concentrations of $1 \times 10^{15}$ cm$^{-3}$ and $1 \times 10^{17}$ cm$^{-3}$, respectively, since these regions were formed by epitaxial growth.

Following the step of 8(c), similar steps to FIGS. 3(d) and 3(e) are executed to produce a lateral MOSFET.

In the manufacturing method of the third embodiment, the p$^-$ channel region 70 is formed from a low-concentration epitaxial layer having an extremely thin thickness. Since this method does not include a step of implanting ions for forming the p$^-$ channel region 70, there is no need to activate the ions that would be otherwise implanted. (It is, however, to be noted that the ions implanted for forming the n$^+$ source region 63 and n$^+$ drain region 64 need to be activated.) In general, ion implantation tends to cause ion damages, most of which may be cured through heat treatment for activation of the ions, but residual defects still remain. In the present embodiment, this problem is advantageously solved to a certain extent, because of the high quality of the film (p$^-$ channel region 70) formed by epitaxial growth.

The third embodiment is also advantageous in that only the donor impurities, such as phosphorous (P) or nitrogen (N), are implanted, and the activation temperature can be made as low as about 1200° C.

Fourth Embodiment

Although the illustrated embodiments are in the form of simple lateral MOSFETs having planar structures, the present invention may be applied to various other types of MOS semiconductor devices.

Figure 9A:
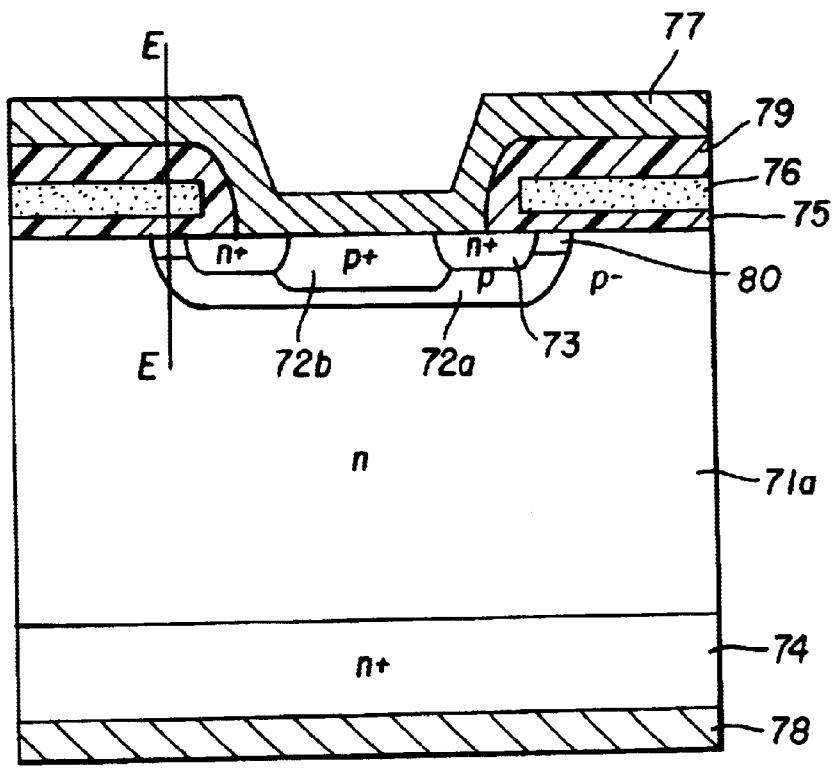
FIG. 9(a) is a cross-sectional view of a vertical MOSFET according to the fourth embodiment of the present invention

FIG. 9(a) is a cross-sectional view showing a unit cell of a SiC vertical MOSFET according to the fourth embodiment of the present invention.

In a wafer in which an n drift layer 71a is laminated on an n$^+$ drain layer 74, a p base region 72a is formed in a surface layer of the n drift layer 71a, and an n$^+$ source region 73 is formed within the p base region 72a. Also, a high-concentration p$^+$ well region 72b is formed overlapping the p base region 72a. A p$^-$ channel region 80 is formed in a portion of a surface layer of the p base region 72a that is interposed between the n$^+$ source region 73 and an exposed surface portion of the n drift layer 71a, and a gate electrode 76 made of polysilicon is formed on a gate insulating film 75 over the surface of the p$^-$ channel region 80. A source electrode 77 is formed in contact with both of the n$^+$ source region 73 and the p$^+$ well region 72b, and a drain electrode 78 is provided on the rear surface of the n$^+$ drain layer 74. Although not illustrated in FIG. 9, a metal electrode is provided which contacts with the gate electrode 76 made of polysilicon. Reference numeral 79 denotes an interlayer insulating film in the form of an Si oxide film that serves to insulate the gate electrode 76 and the source electrode 77 from each other.

The dimensions of the respective layers or regions of the above-described device are as follows: the n$^+$ drain layer 74 has an impurity concentration of $1 \times 10^{18}$ cm$^{-3}$ and a thickness of 350 μm, and the n drift layer 71a has an impurity concentration of $1 \times 10^{16}$ cm$^{-3}$ and a thickness of 10 μm. The p base region 72a has the maximum impurity concentration of $1 \times 10^{17}$ cm$^{-3}$, a junction depth of 1 μm, and a width of about 15 μm, and the n$^{30}$ source region 73 has a surface impurity concentration of $1 \times 10^{19}$ cm$^{-3}$, a junction depth of 0.3 μm, and a width of about 5 μm. The p$^+$well region 72b has a surface impurity concentration of $1 \times 10^{19}$ cm$^{-3}$C., a junction depth of 0.8 μm and a width of about 10 μm, while the p$^-$ channel region 80 has a surface impurity concentration of $1 \times 10^{15}$ cm$^{-3}$ and a junction depth of 0.2 μm. The gate insulating film 75 has a thickness of 50 nm, and the gate electrode 76 has a thickness of 1 μm, while the interlayer insulating film 79 has a thickness of 2 μm. The pitch of unit cells as shown in FIG. 1 is about 25 μm.

Figure 9B:
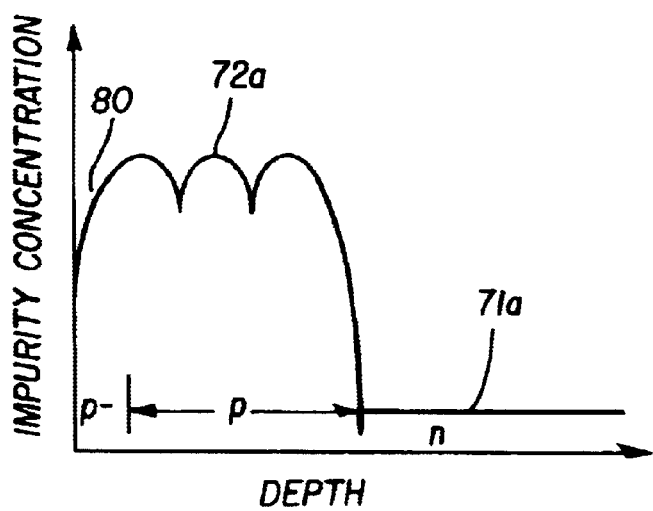
FIG. 9(b) is a graph showing the distribution of the impurity concentration in a cross section taken along line E—E of FIG. 9(a)

FIG. 9(b) shows the distribution of the impurity concentration in a cross section taken along line E—E of FIG. 9(a). In FIG. 9(b), the p$^-$ channel region 80 has a relatively low surface impurity concentration, and the p base region 72a located below the p$^-$ channel region 80 has a relatively high impurity concentration. The low-concentration p$^-$ channel region 80 can be realized through multiple ion implantation in which ions of acceptor impurities are implanted a plurality of times while suitably controlling the acceleration voltage and dose amount in the same manner as in the first embodiment. The method of the present embodiment is, however, different from that of the first embodiment in that the ions for forming the p$^-$ channel region 80 must be implanted in a selected area of the substrate, using a suitable mask.

In the vertical MOSFET of the fourth embodiment, the p$^-$ channel region 80 having a low impurity concentration is formed right under the gate insulating film 75, thus assuring a sufficiently high electron mobility of an inversion layer that is induced upon application of a positive voltage to the gate electrode, with the result of reduced ON-state resistance.

The p$^-$ channel region 80 may also be formed by implanting a small amount of ions of donor impurities into the p base region so that acceptors in the base region cancel out the donors, in the same manner as in the second embodiment, or using an epitaxial layer in the same manner as in the third embodiment, though these processes are more or less complicated.

While the later MOSFET and vertical MOSFET having the most fundamental structures have been illustrated above as the embodiments of the present invention, it is to be understood that the present invention is equally applicable to other types of power semiconductor devices, such as UMOSFET having a gate of a trench structure, MOS thyristor, and insulated-gate bipolar transistor (IGBT).

In the conventional silicon carbide n channel MOS semiconductor device as described above, the ON-state resistance is depending upon a large series resistance component of its inversion layer. According to the present invention, on the other hand, the acceptor concentration of the outermost surface layer of the p base region right under the gate insulating film is controlled to $1 \times 10^{13}$ to $1 \times 10^{16}$ cm$^{-3}$, so as to improve the mobility of the inversion layer and thus significantly reduce its series resistance component. This makes it possible to utilize excellent characteristics inherently possessed by SiC in the silicon carbide MOS semiconductor device.

In the method for manufacturing such a SiC MOS semiconductor device, the acceptor concentration of the surface layer of the p base region may be suitably controlled by implanting ions of acceptor impurities, or implanting ions of donor impurities that will cancel out acceptors in the surface layer of the p base region, or forming a low-concentration layer by epitaxial growth on the surface of the p base region. Thus, the MOS semiconductor device having low ON-state resistance can be easily produced by any of these methods.

Accordingly, the present invention makes a great contribution to the development and prevalence of, in particular, power silicon carbide MOS semiconductor devices.

What is claimed is:

1. A silicon carbide n channel MOS semiconductor device, comprising:
    a semiconductor substrate comprising silicon carbide, said substrate including a p base region, an $n^+$ source region and an $n^+$ drain region;
    a gate insulating film formed on a surface of the p base region;
    a gate electrode provided on the gate insulating film; and
    first and second main electrodes that allow current to flow therebetween;
    wherein current flowing between the first and second main electrodes is controlled by controlling an electron concentration of an inversion layer that is induced in a surface layer of the p base region located under the gate insulating film when a positive voltage is applied to the gate electrode;
    wherein an effective acceptor concentration measured in the vicinity of an interface between the p base region and the gate insulating film is in a range of $1\times10^{13}$ to $1\times10^{16}$ cm$^{-3}$; and
    wherein an impurity concentration in the surface layer of the p base region is relatively lower than an impurity concentration of the p base region.

2. A silicon carbide n channel MOS semiconductor device according to claim 1, wherein an impurity concentration of an inner part of the semiconductor substrate is higher than that in the vicinity of the interface between the p base region of the substrate and the gate insulating film.

3. A silicon carbide n channel MOS semiconductor device comprising:
    a semiconductor substrate comprising silicon carbide, said substrate including a p base region, an $n^+$ source region and an $n^+$ drain region;
    a gate insulating film formed on a surface of the p base region;
    a gate electrode provided on the gate insulating film; and
    first and second main electrodes that allow current to flow therebetween;
    wherein current flowing between the first and second main electrodes is controlled by controlling an electron concentration of an inversion layer that is induced in a surface layer of the p base region located under the gate insulating film when a positive voltage is applied to the gate electrode; and
    wherein a total amount x per unit area of donor impurities introduced into a surface layer of the p base region is in a range represented by:

$$1\times10^{11} \text{ cm}^{-2} < x < 5Q_B/q,$$

$$Q_B = (4\in_o \in_s \Phi_B N_A)^{1/2}$$

where $\in_o$ is a dielectric constant in vacuum, $\in_s$ is a dielectric constant of silicon carbide, $\Phi_B$ is an energy difference between an intrinsic Fermi level and a Fermi level of silicon carbide, $N_A$ is an acceptor concentration of the p base region before implantation of donor ions, and q is an intrinsic charge.

4. A silicon carbide n channel MOS semiconductor device according to claim 3, wherein the donor impurities introduced into the surface layer of the p base region comprise nitrogen or phosphorous.

5. A silicon carbide n channel MOS semiconductor device according to claim 1,
    wherein the p base region is in direct contact with the $n^+$ source region and the $n^+$ drain region.

6. A silicon carbide n channel MOS semiconductor device according to claim 1, further comprising:
    an n drift layer which is located between the p base region and the $n^+$ drain region.

7. A silicon carbide n channel MOS semiconductor device according to claim 6,
    wherein the p base region is in direct contact with the $n^+$ source region and the n drift layer.

8. A silicon carbide n channel MOS semiconductor device according to claim 3,
    wherein the p base region is in direct contact with the $n^+$ source region and the $n^+$ drain region.

9. A silicon carbide n channel MOS semiconductor device according to claim 3, further comprising:
    an n drift layer which is located between the p base region and the $n^+$ drain region.

10. A silicon carbide n channel MOS semiconductor device according to claim 9,
    wherein the p base region is in direct contact with the $n^+$ source region and the n drift layer.

* * * * *